(12) United States Patent
Sawada et al.

(10) Patent No.: US 7,429,446 B2
(45) Date of Patent: Sep. 30, 2008

(54) RESIST PATTERN FORMING METHOD AND SEMICONDUCTOR DEVICE FABRICATION METHOD

(75) Inventors: Ken Sawada, Isehara (JP); Kozo Makiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 565 days.

(21) Appl. No.: 10/804,179

(22) Filed: Mar. 19, 2004

(65) Prior Publication Data

US 2005/0069813 A1 Mar. 31, 2005

(30) Foreign Application Priority Data

Sep. 30, 2003 (JP) .............................. 2003-339868

(51) Int. Cl.
*G03F 7/26* (2006.01)
(52) U.S. Cl. .................................... 430/311
(58) Field of Classification Search ................ 430/311
See application file for complete search history.

(56) References Cited

U.S. PATENT DOCUMENTS 4,654,295 A * 3/1987 Yang et al. ................. 430/314
6,270,929 B1 * 8/2001 Lyons et al. ................... 430/5

FOREIGN PATENT DOCUMENTS

| JP | 07-153666 A | 6/1995 |
| JP | 08-115923 A | 5/1996 |
| JP | 10-073927 A | 3/1998 |
| JP | 11-307549 A | 11/1999 |

* cited by examiner

*Primary Examiner*—Kathleen Duda
(74) *Attorney, Agent, or Firm*—Westerman, Hattori, Daniels & Adrian, LLP.

(57) ABSTRACT

A photoresist film 12 is formed on a substrate 10. In the photoresist film 12, an opening 13 having higher hydrophilicity and higher affinity with a chemical liquid 16 for swelling the photoresist film at upper part of the sidewall is formed down to the substrate 10. The chemical liquid 16 is reacted with the photoresist film 12 with the opening formed in to swell the photoresist film 16 to thereby reverse-taper the sidewall of the opening. Whereby the photoresist film having an opening diameter beyond a resolution of the photoresist material and the sidewall of the opening reverse-tapered can be easily formed.

25 Claims, 14 Drawing Sheets

RESIST PATTERN FORMING METHOD AND SEMICONDUCTOR DEVICE FABRICATION METHOD

CROSS-REFERENCE TO RELATED APPLICATIONS

This application is based upon and claims the benefit of priority from the prior Japanese Patent Application No. 2003-339868, filed on Sep. 30, 2003, the entire contents of which are incorporated herein by reference.

BACKGROUND OF THE INVENTION

The present invention relates to a resist pattern forming method and a semiconductor device fabrication method, more specifically a resist pattern forming method for forming a resist pattern having a downsized opening beyond a resolution of a photoresist and a semiconductor device fabrication method using said the resist pattern forming method.

In field effect transistors using compound semiconductor materials, evaporation/lift-off method is widely used in forming the gate electrodes and ohmic electrodes so as to decrease damages to the semiconductor surfaces (refer to, e.g., Reference 1 (Japanese published unexamined patent application No. Hei 07-153666), Reference 2 (Japanese published unexamined patent application No. Hei 08-115923), and Reference 3 (Japanese published unexamined patent application No. Hei 11-307549)). In the process of forming the electrodes by lift-off method, photoresist films having openings the end of which is reverse-tapered or formed in eave-shape is formed.

As one means for forming a photoresist film having such configuration is known a method using 2 kinds of photoresist materials of different sensitivities. In this method, the photoresist film of a lower sensitivity is formed on the photoresist film of a higher sensitivity, and these photoresist films are concurrently exposed and developed. The opening width is larger in the photoresist film of the higher sensitivity than in the photoresist film of the lower sensitivity, whereby a photoresist film having an eave-shaped end can be formed. As another means for forming a photoresist film having such configuration is proposed a method using a UV sensitive resist with a UV absorbing dye added.

FIGS. 13A-13D and 14A-14C are sectional views of the semiconductor device in the steps of the conventional semiconductor device fabrication method using the evaporation/lift-off method and the two-layer resist process, which show the method.

A silicon nitride film, for example, is deposited on a compound semiconductor substrate 100 by, e.g., CVD method to form an insulating film 102 of the silicon nitride film (FIG. 13A).

Next, a photoresist film 104 exposing a region for the gate electrode to be formed in is formed on the insulating film 102 by photolithography (FIG. 13B).

Then, with the photoresist film 104 as the mask, the insulating film 102 is dry-etched to form an opening 106 in the insulating film 102 down to the compound semiconductor substrate 100.

Next, the photoresist film 104 is removed by, e.g., ashing method (FIG. 13C).

Then, on the insulating film 102 with the opening 106 formed in, a photoresist film 108, and a photoresist film 110 which is different from the photoresist film 108 in the optical characteristics and the etching characteristics.

Next, the photoresist film 108 is patterned by photolithography to form an opening 112 in the photoresist film 110 in a region containing the region for the opening 106 formed in.

Then, with the photoresist film 110 as the mask, the photoresist film 108 is isotropically etched by, e.g., wet etching to form in the photoresist film 108 an opening 114 which is wider than the opening 112 (FIG. 13D).

Next, a metal film 116 to be the gate electrode is deposited by, e.g., evaporation method (FIG. 14A).

Then, the photoresist films 108, 110 are removed with, e.g., a resist releasing agent. Concurrently therewith the metal film 116 on the photoresist film 110 is removed (lift-off) together with the photoresist films 108, 110. Thus, the gate electrode 118 of the metal film 116 connected to the compound semiconductor substrate 100 through the opening 106 can be formed (FIG. 14B).

On the other hand, as semiconductor devices are more downsized, the wavelength of the exposure light used in the photolithography is made shorter. However, the making the wavelength of the exposure light shorter needs large expenses and much time for the studies and investments of photoresist materials having resolutions corresponding to shorter wavelengths, exposure systems, etc. The electron beam lithography has found it difficult to ensure the same throughput as the photolithography. Techniques of forming more downsized patterns than resolutions of the photoresists are being studied, and techniques of lasting the exposure light wavelengths are being studied.

In such background, as a technique of forming a photoresist film having a downsized pattern beyond the resolution of the photoresist film, a prescribed auxiliary agent is reacted with the patterned photoresist film to swell the resist pattern to thereby more downsize the pattern formed by the photolithography is developed (refer to, e.g., Reference 4 (Japanese published unexamined patent application No. Hei 10-073927) and Reference 5 ("Advanced Micro-Lithography Process for I-line Lithography", T, Ishibashi et al., Jpn. J. Appl. Phys. vol. 40 (2001) p. 7156)).

SUMMARY OF THE INVENTION

To form the electrode by the lift-off method, as described above, the ends of the opening in the resist pattern must be reverse-tapered or formed in an eave-shape. To lower the fabrication cost, it is advantageous that the photolithography uses an inexpensive exposure system using, e.g., i-line.

However, the technique using i-line exposure has found it difficult to form downsized lift-off electrodes of below 0.4 µm. The methods described in Reference 4 and Reference 5 described above cannot form the resist patterns reverse-tapered.

In the conventional semiconductor fabrication methods shown in FIGS. 13A-14B, the opening 106 formed in the insulating film 102 and the opening 112 formed in the photoresist film 110 are formed in the separate photolithography steps. Thus, when the opening 106 and the opening 112 are disalignment with each other, as shown in FIG. 14C, the length of the parts of the gate electrode 118 on the insulating film 102 is varied. The parts of the gate electrode 118 on the insulating film determine the breakdown voltage of the device and the parasitic capacitance of the gate electrode. Thus, the conventional semiconductor fabrication methods often varied device characteristics due to the disalignment in the photolithography steps.

An object of the present invention is to provide a resist pattern forming method for forming a resist pattern having an opening whose opening diameter is downsized beyond the resolution of the photoresist, and the end of which is reverse-tapered or formed in an eave-shape, and a semiconductor device fabrication method using said the resist pattern forming method.

According to one aspect of the present invention, there is provided a resist pattern forming method comprising the steps of: forming on a substrate a photoresist film having an opening down to the substrate; and reacting a chemical liquid for swelling the photoresist film with the photoresist film having the opening to swell the photoresist film and to reverse-taper a sidewall of the opening.

According to another aspect of the present invention, there is provided a semiconductor device fabrication method comprising the steps of: forming over a semiconductor substrate a photoresist film having an opening down to the semiconductor substrate; reacting a chemical liquid for swelling the photoresist film with the photoresist film having the opening to swell the photoresist film and to reverse-taper a sidewall of the opening; and depositing a conducting film, and then selectively removing the conducting film on the photoresist film together with the photoresist film to form an electrode of the conducting film in the opening.

According to further another aspect of the present invention, there is provided a semiconductor device fabrication method comprising the steps of: forming an insulating film over a semiconductor substrate; forming on the insulating film a photoresist film having a first opening down to the insulating film; etching the insulating film with the photoresist film as a mask to form a second opening in the insulating film down to the semiconductor substrate; reacting a chemical liquid for swelling the photoresist film with the photoresist film having the first opening to swell the photoresist film and to reverse-taper a sidewall of the first opening; and depositing a conducting film, and then selectively removing the conducting film on the photoresist film together with the photoresist film to form an electrode of the conducting film in the second opening.

According to the present invention, when the photoresist film is swelled, a depth-wise distribution of the hydrophilicity and the affinity with the resist pattern swelling material is utilized to make the swelling amount larger at upper parts of the opening, whereby the photoresist film can have the opening having the side reverse-tapered.

The opening is formed in the photoresist film by photolithography, and then the swelling processing is performed, whereby the opening can have a smaller diameter than the opening diameter opened by the photolithography. Thus, the opening can have an opening diameter of below a resolution of the photoresist and have the sidewall reverse-tapered. The photoresist film having such opening is suitable to form electrodes by lift-off method.

Even in forming a T-shaped gate electrode having the ends extended on an insulating film, the gate electrode can be formed by one photolithography step. This makes the fabrication process simple, and the over-gate portion of the gate electrode can be aligned with the opening easily and high reproducibility. Thus, device characteristic fluctuations can be drastically decreased.

DETAILED DESCRIPTION OF THE INVENTION

[A First Embodiment]

Figure 1A:
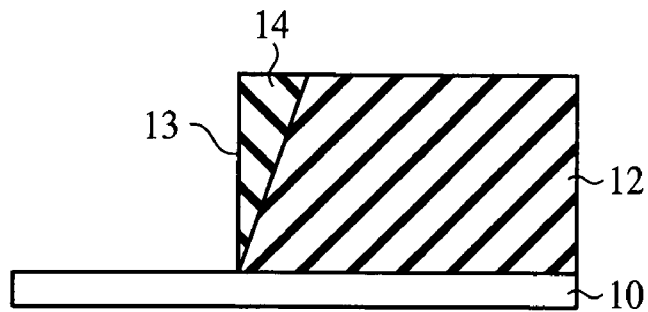
FIGS. 1A-1C are sectional views showing a resist pattern forming method according to a first embodiment of the present invention.
Figure 1B:
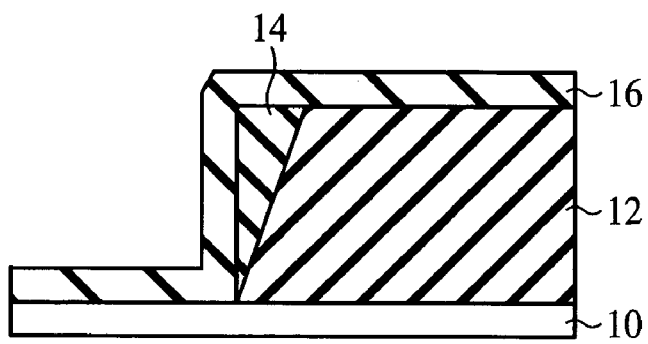
Figure 1C:
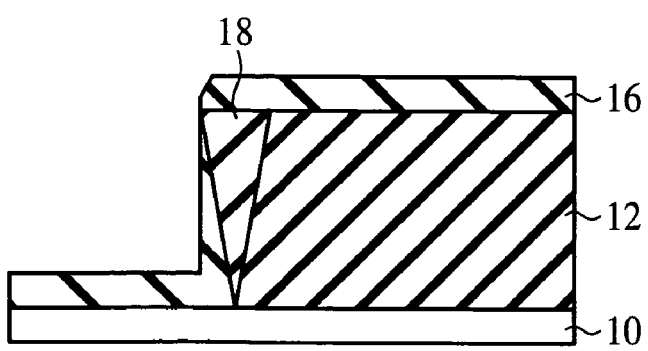
Figure 2:
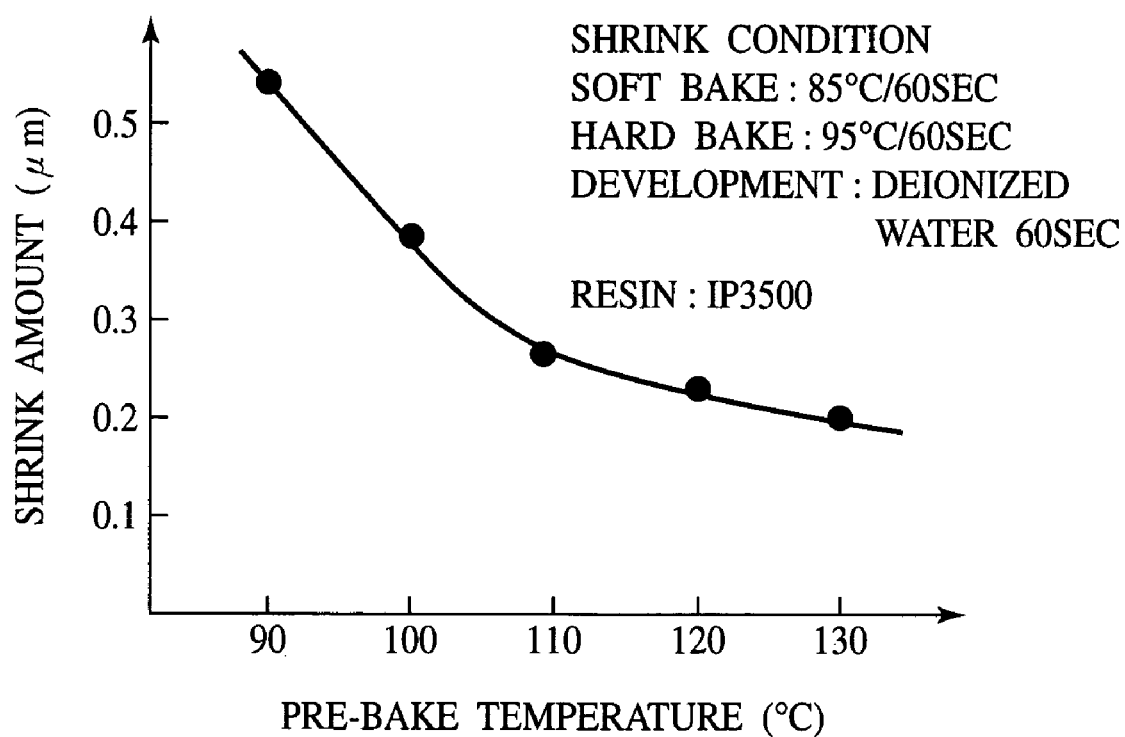
FIG. 2 is a graph of relationships between the shrink amount and the pre-bake temperature.
Figure 3:
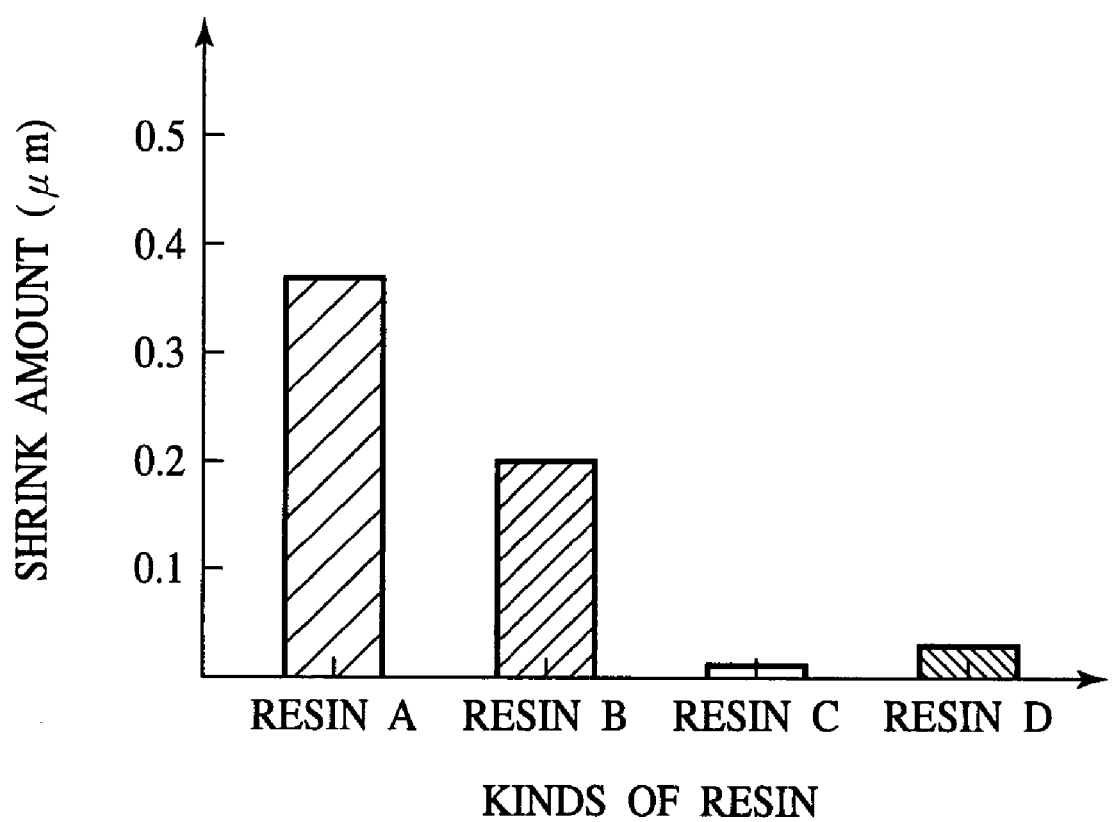
FIG. 3 is a graph of relationships between the shrink amount and kinds of resin.

The resist film forming method according to a first embodiment of the present invention will be explained with reference to FIGS. 1A to 3. FIGS. 1A-1C are sectional views showing the resist pattern forming method according to the present embodiment. FIG. 2 is a graph of relationship between shrinkage amounts and pre-bake temperatures. FIG. 3 is a graph of relationship between shrinkage amounts and kinds of resins.

As described in, e.g., Reference 4 and Reference 5, as a technique of forming a downsized resist pattern is known a method in which a prescribed auxiliary agent is reacted with a patterned photoresist film to swell the resist pattern to thereby more downsize the pattern formed by the photolithography.

The inventors of the present application have made earnest studies of the above-described technique and have made it clear for the first time that a patterned novolak-based photoresist is reacted with a prescribed resist pattern swelling material to thereby form a resist pattern having an opening whose shrink ratio is larger toward the upper end, i.e., whose end is reverse-tapered. In this specification, the reverse-taper means that the width of the opening is decreased upward.

Novolak-based photoresist materials are photoresist materials which are popular in the semiconductor device fabrication and are formed of novolak resin as the base resin and naphthoquinone diazido-based photosensitizers. Such photoresist materials have low solubility for alkaline developers in the non-exposed part and, in the exposed part, the photosensitizers are changed to indene carboxylate, which increases the solubility for the developers.

An opening formed by exposing and developing a novolak-based photoresist has the end surface thereof made hydrophilic by the effect of the novolak resin containing phenol groups, which are hydrophilic. A chemical liquid for swelling the hydrophilic resist pattern (resist pattern swelling material) is reacted with the opening, and the hydrophilic materials physichemically adsorb each other, and are mixed and crosslinked with each other by the later baking, whereby the shrink of the opening diameter can be realized.

At this time, the novolak-based photoresist has larger ratios of the mixing and crosslinking at higher parts of the opening. The detailed mechanism that the ratios of the mixing and crosslinking are higher at upper parts of the openings is not clear, but the novolak-based photoresist will have higher ratios of the resist denaturation in the direction of depth of light incidence. That is, it is supposed that, in the novolak-based photoresist, the ratio of the photosensitizer being denatured to indene carboxylate is sensitively varied in the direction of depth of light incidence, whereby upper parts of the opening have more hydrophilic than lower parts of the opening. It is also supposed that upper parts of the novolak-based photoresist are exposed to an alkaline developer for a longer period of time, whereby the ratio of the penetration of the alkaline developer into the resist is varied, and upper parts of the opening are more hydrophilic than lower parts of the opening.

Poly (methyl methacrylate)-based resists can be subjected to the same swelling processing. For example, an opening is formed in a poly (methyl methacrylate)-based resist by electron beam lithography or others, and then oxygen ashing, for example, is performed at the upper part of the opening. A pattern swelling material is reacted with the opening, and the substances of high hydrophilicity physichemically adsorb each other and penetrate into each other, and are mixed and crosslinked by the later baking, whereby the shrink of the opening diameter can be realized. In this case, upper parts of the opening, which are more exposed to oxygen plasmas have higher hydrophilicity and higher affinity and have shrink amounts which are about 3-4 times shrink amounts of parts which have not been exposed to the oxygen plasmas.

The above-described mechanism will be explained together with the resist pattern forming method according to the present embodiment will be explained.

A photoresist film 12 of a novolak-based photoresist material is formed on a substrate 10. The novolak-based photoresist material can be, e.g., a resist material comprising novolak resin as the base resin and a naphthoquinone diazido as the photosensitizer.

Then, the photoresist film 12 is exposed and developed to form an opening 13 in the photoresist film 12 by photolithography. At this time, the sensitivity of the photosensitizer and the penetration of the developer vary in the direction of the depth, and as shown in FIG. 1A, it is considered that a hydrophilic region 14 is wider upward.

Then, a resist pattern swelling material is applied to the substrate 10 with the photoresist film 12 patterned to form a resist pattern swelling film 16 (FIG. 1B).

Next, thermal processing (soft bake) is performed, e.g., at 85° C. and 60 seconds to make the photoresist film 12 and the resist material swelling film 16 affinitive with each other (mixing).

Then, thermal processing (hard bake) is performed, e.g., at 95° C. for 60 seconds to accelerate the crosslinking between the resist pattern swelling material penetrated into the photoresist film 12 and the resist material.

At this time, because the resist pattern swelling material is hydrophilic, the hydrophilic substances physichemically adsorb each other, and the mixing and crosslinking more tends to take place in upper regions of the opening, where a high hydrophilicity region 14 is larger. Accordingly, a mixing region 18 in a shape that is more projected at upper parts of the opening is formed (FIG. 1C).

Then, the resist pattern swelling film 16 which has not been crosslinked is removed to form a photoresist film having the side wall of the opening reverse-tapered.

The photoresist film having the side wall of the opening reverse-tapered by the resist pattern forming method described above is suitable as a photoresist film to be used in lifting off electrode materials.

As described above, the novolak-based photoresist material comprises, e.g., novolak resin as the base resin, and a naphthoquinone diazido-based photosensitizer.

Novolak resin generically call resins prepared by condensing phenol and formaldehyde in the presence of an acidic catalyst, such as sulfuric acid, hydrochloric acid or others. The phenol can be m-cresol, p-cresol, dimethylphenol, trimethylphenol or others. The condensing agent can be formaldehyde, salicylaldehyde or others.

Characteristics of the resist are influenced by the monomer species of the novolak resin and their composition, molecular weights, molecular weight distributions, arrangements of the monomer units, dissolution rates, etc. These parameters can be selected suitably for required characteristics. For example, to suppress decreases of the developer film thickness in the non-exposed part for higher contrast of the pattern, dimethylphenol or trimethylphenol, which tends to decrease the dissolution rate, is added, and arrangements of the monomer units, in which the phenol is condensed at the p-positions, are positively used by controlling the condensation reaction to thereby accelerate the diazo coupling reaction in the non-exposed region.

As the naphthoquinone diazido-based photosensitizer, naphtoquinon-1,2-diazido-5-sulfonic ester can be used. Naphtoquinon-1,2-diazido-5-sulfonic ester may be ester-bonded with polyhydric phenol compounds, which are called a ballast compound.

As the resist pattern swelling material to be reacted with the novolak-based photoresist material or the poly (methyl methacrylate)-based resist material, a material containing a resin, a crosslinking agent and a surfactant and further containing a resin having a water soluble aromatic compound or an aromatic compound, an organic solvent, other components, etc. which are selected suitably as required can be used.

The resist pattern swelling material is water soluble or alkali soluble. The resist pattern swelling material may have states as of aqueous solution, colloidal liquid, emulsion or others, but the state of aqueous solution is preferable.

The resin forming the resist pattern swelling material is not specifically limited and can be selected suitably for ends. The resin is preferably water soluble or alkali soluble and more preferably is reactive to crosslink or is not reactive to crosslink but mixable with a water soluble crosslinking agent.

When the above-described resin is a water soluble resin, the water soluble resin preferably exhibits the water solubility of not less than 0.1 g for water of 25° C.

Such water soluble resin is, e.g., poly (vinyl alcohol), poly (vinyl acetal), poly (vinyl acetate), polyacrylate, poly vinylpyrrolidone, poly (ethylene imine), poly (ethylene oxide), styrene-maleic acid copolymer, poly (vinyl amine), polyallylamine, oxazoline group-content water soluble resin, water soluble melamine resin, water soluble urea resin, alkyd resin, sulfonamide resin or others.

When the above-described resin is alkali soluble, the alkali soluble resin preferably exhibits the alkali solubility of not less than 0.1 g for a 2.38% TMAH aqueous solution of 25° C.

Such alkali soluble resin is, e.g., novolak resin, vinylphenol resin, polyacrylate, polymethacrylate, poly (p-hydroxyphenyl) acrylate, poly (p-hydroxyphenyl) methacrylate, their copolymers or others.

One of the above-described resins may be singly used, or 2 or more of the above-described resins may be used together.

Our of the above-described resins, poly (vinyl alcohol), poly (vinyl acetal), poly (vinyl acetate) are preferable.

The content of the above-described resins in the resist pattern swelling material varies, depending on kinds, contents, etc. of the crosslinking agent, etc. and cannot be unconditionally decided. The content can be decided suitably for ends.

The crosslinking agent forming the resist pattern swelling material is not especially limited and can be selected suitably for ends. Water soluble crosslinking agents which thermally or acidly crosslink are preferable. For example, amino-based crosslinking agents are preferable.

The above-described amino-based crosslinking agents are, e.g., melamine derivatives, urea derivatives, uryl derivatives, etc. These may be used singly, or 2 or more of them may be used together.

The above-described urea derivatives are, e.g., urea, alkoxymethylene urea, N-alkoxymethylene urea, ethylene urea, ethylene urea carboxylate, their derivatives, etc.

The above-described melamine derivatives are, e.g., alkoxy methyl melamine, its derivatives, etc.

The uryl derivatives are, e.g., benzoguanamine, glycoluryl, their derivatives, etc.

The content of the above-described crosslinking agent in the resist pattern swelling material varies, depending on kinds, contents, etc. of the crosslinking agent, etc. and cannot be unconditionally decided. The content can be decided suitably for ends.

The surfactant included in the resist pattern swelling material is not especially limited and can be selected suitably for ends. The surfactant is a non-ionic surfactant, a cationic surfactant, anionic surfactant, an amphoteric surfactant or others. These surfactants can be singly used, or 2 or more of them may be used together. Out of these surfactants, the non-ionic surfactant is preferable because the non-ionic surfactant contains no metal ions.

The above-described non-ionic surfactant is suitably selected out of alkoxylate-based surfactants, fatty acid ester-based surfactants, amide-based surfactants, alcohol-based surfactants and ethylenediamine-based surfactants. Specific examples of these surfactants are poly (oxyethylene)-poly (oxypropylene) condensation product compounds, polyoxyalkylene alkyl ether compounds, poly (oxyethylene) derivative compounds, sorbitan fatty acid ester compounds, glycerin fatty acid ester compounds, primary alcohol ethoxylate compounds, phenol ethoxylate compounds, nonyl phenol ethoxylate group, octyl phenol ethoxylate group, lauryl alcohol ethoxylate group, oleyl alcohol ethoxylate group, fatty acid ester group, amide group, natural alcohol group, ethylenediamine group, secondary alcohol ethoxylate group, etc.

The above-described cationic surfactant is not especially limited and can be suitably selected for ends. The cationic surfactant is exemplified by alkyl cation-based surfactants, amide-type quarternary cation-based surfactants, ester-type quarternary cation-based surfactants, etc.

The above-described amphoteric surfactant is not especially limited and can be selected suitably for ends. The amphoteric surfactant is exemplified by amine oxide-based surfactants, betaine-based surfactants, etc.

The content of the above-described surfactant in the resist pattern swelling material varies, depending on kinds, contents, etc. of the above-described resin, the crosslinking agent, etc. and cannot be unconditionally decided. The content can be decided suitably for ends.

The resist pattern swelling material which contains a water soluble aromatic compound is preferable because such resist pattern swelling material can conspicuously improve the etching resistance.

The above-described water soluble aromatic compound is not especially limited as long as the water soluble aromatic compound is an aromatic compound and is water soluble and can be selected suitably for ends. An aromatic compound which exhibits the water solubility of not less than 1 g in 100 g of water of 25° C. is preferable, more preferably exhibit the water solubility of not less than 3 g in 100 g of water of 25° C., and especially preferably exhibits the water solubility of not less than 5 g in 100 of water of 25° C.

The above-described aromatic compound is exemplified by polyphenol compounds, aromatic carboxylic compounds, naphthalene polyhydric alcohol compounds, benzophenone compounds, flavonoid compounds, porphine, water soluble phenoxy resins, aromatic compound-content water soluble dyes, their derivatives, their glycosides or others. They may be used singly, or 2 or more of them may be used together.

The above-described polyphenol compounds and their derivatives are exemplified by catechin, anthocyanidin (pelargonidin-type (4'-hydroxy), cyanidin-type (3', 4'-dihydroxy), delphinidin-type (3',4',5'-trihydroxy)), flavan-3,4-diol, proanthocyanidin, resorcin, resorcin [4] arene, pyrogallol, gallic acid, their derivatives or their glycosides or others.

The above-described aromatic carboxylic compounds and their derivatives are exemplified by salicylic acid, phthalic acid, dihydroxybenzoic acid, tannin, their derivatives, their glycosides or others.

The above-described naphthalene polyhydric alcohol compounds and their derivatives are exemplified by naphthalene diol naphthalene triol, their derivatives or their glycosides or others.

The above-described benzophenone compounds and their derivatives are exemplified by Alizarin Yellow A, its derivatives, its glycosides or others.

The above-described flavonoid compounds and their derivatives are exemplified by flavone, isoflavone, flavanol, flavonon, flavonol, flavan-3-ol, olon, chalcone, dihydrochalcone, quercetin, their derivatives, their glycosides or others.

Among the above-described water soluble aromatic compounds, a compound having 2 or more polar groups is preferable, more preferably 3 or more polar groups, and especially preferably 4 or more polar groups.

The above-described polar group is not especially limited and can be selected suitably for ends. The polar group is exemplified by hydroxyl group, carboxyl group, carbonyl group, sulfonyl group or others.

The content of the above-described water soluble aromatic compound in the resist pattern swelling material can be decided suitably in accordance with kinds and contents, etc. of the resin, the crosslinking agent, etc.

It is preferable that the resist pattern swelling material contains a resin partially contains an aromatic compound, because the etching resistance can be conspicuously improved.

The above-described resin partially containing an aromatic compound is not especially limited and can be selected suitably for ends. Preferably the resin can cause crosslinking reaction and is exemplified by poly (vinyl aryl acetal) resin, poly (vinyl aryl ether) resin, poly (vinyl aryl ester) resin, their derivatives, etc. The resin is preferably at least one of them, and more preferably has acetyl groups because the resin exhibits the suitable water solubility and alkali solubility. One of the resins may be used singly, or 2 or more may be used together.

The above-described poly (vinyl aryl acetal) resin is not especially limited and can be selected suitably for ends. The resin is exemplified by β-resorcin acetal, etc.

The above-described poly (vinyl aryl ether) resin is not especially limited and can be selected suitably for ends. The resin is exemplified by 4-hydroxy benzyl ether, etc.

The above-described poly (vinyl aryl ester) resin is not especially limited and can be selected suitably for ends. The resin is exemplified by benzoate, etc.

The process for producing the above-described poly (vinyl aryl acetal) resin is not especially limited and can be selected suitably for ends. The process is exemplified suitably by the known production process using poly (vinyl acetal) reaction. For example, in the production process poly (vinyl alcohol) and a quantity of aldehyde stoichiometrically required for the poly (vinyl alcohol) are acetalized in the presence of anacidic catalyst. Specifically, the processes disclosed in U.S. Pat. Nos. 5,169,897, 5,262,270, Japanese published unexamined patent application No. Hei 05-78414, etc. are preferable.

The process for producing the above-described poly (vinyl aryl ether) resin is not especially limited and can be selected suitably for ends. The process may be, e.g., the copolymerization between the corresponding vinyl aryl ether monomers and vinyl acetate, the etherification between poly (vinyl alcohol) and an aromatic compound having alkyl halide group in the presence of a basic catalyst (Williamson ether synthesis) or others. Specifically, the processes disclosed in Japanese published unexamined patent application No. 2001-40086, Japanese published unexamined patent application No. 2001-181383, Japanese published unexamined patent application No. Hei 06-116194, etc. are preferable.

The process for producing the above-described poly (vinyl aryl ester) resin is not especially limited and can be selected suitably for ends. The process can be, e.g., the copolymerization between the corresponding vinyl aryl ester monomers and vinyl acetate, the esterification between poly (vinyl alcohol) and an aromatic carboxylic halide compound in the presence of a basic catalyst or others.

The aromatic compound in the above-described resin partially having an aromatic compound is not especially limited and can be selected suitably for ends. The aromatic compound is preferably exemplified by compounds having a plurality of linked aromatic rings (polycyclic aromatic compounds, such as naphthalene, anthracene, etc.), such as benzene derivatives of monocyclic aromatic compounds, pyridine derivatives etc.

The aromatic compound in the above-described resin partially having an aromatic compound suitably has, in terms of suitably water solubility, at least one of the functional groups or the sugar derivatives, e.g., hydroxyl group, cyano group, alkoxyl group, carboxyl group, amino group, amide group, alkoxycarbonyl group, hydroxylalkyl group, sulfonyl group, acid anhydride group, lactone group, cyanate group, isocyanate group, ketone group, etc. and more preferably at least one functional group selected out of hydroxyl group, amino group, sulfonyl group, carboxyl group and groups of their derivatives.

The mol content ratio of the aromatic compound of the above-described resin partially having an aromatic compound is not especially limited as long as the etching resistance is not influenced and can be selected suitably for ends. The mol content ratio is preferably above 5 mol % when the etching resistance must be high and more preferably above 10 mol %. The mol content ratio of the aromatic compound of the above-described resin partially having an aromatic compound can be measured by, e.g., NMR or others.

The content of the above-described resin partially having an aromatic compound in the resist pattern swelling material can be decided suitably in accordance with kinds and contents of the above-described resin, the above-described crosslinking agent, etc.

The above-described organic solvent is contained in the resist pattern swelling material to thereby improve the solubility of the above-described resin, the above-described crosslinking agent, etc. in the resist pattern swelling material.

The organic solvent is not especially limited and can be selected suitably for ends. The organic solvent is exemplified by alcohol-based organic solvents, chain ester-based organic solvents, cyclic ester-based organic solvents, ketone-based organic solvents, chain ether-based organic solvents, cyclic ether-based organic solvents, etc.

The above-described alcohol-based organic solvents are exemplified by methanol, ethanol, propyl alcohol, isopropyl alcohol, butyl alcohol, etc.

The above-described chain ester-based organic solvents are exemplified by ethyl lactate, propylene glycol methyl ether acetate, (PGMEA), etc.

The above-described cyclic ester-based organic solvents are exemplified by lactone-based organic solvents, such as γ-butyrolactone, etc., and others.

The above-described ketone-based organic solvents are exemplified by ketone-based organic solvents, as of acetone, cyclohexanone, heptanone, etc., and others.

The chain ether-based organic solvents are exemplified by ethylene glycol dimethyl ether, etc.

The cyclic ether-based organic solvents are exemplified by tetrahydrofuran, dioxane, etc.

One of these organic solvents may be singly used, or 2 or more of these organic solvents may be used together. Among these organic solvents, the organic solvents having an about 80-200° C. boiling point are preferable.

The content of the above-described organic solvents in the resist pattern swelling material can be decided suitably in accordance with kinds, contents, etc. of the above-described resin, the above-described crosslinking agent, the above-described surfactant, etc.

Other components may be selected suitably for ends without special limitation as long as the other components do not influence the effect of the present invention, and are exemplified by known various additives, e.g., a thermal acid generating agent, and a quencher typically an amine-based, an amide-based, ammonium chlorine or others.

The content of the above-described other components in the resist pattern swelling material can be decided suitably in accordance with kinds, contents, etc. of the above-described resin, the above-described crosslinking agent, etc.

The total content of the components of the resist pattern swelling material other than water is usually 1-80 mass %, preferably 5-50 mass % and more preferably 10-20 mass % in terms of the swelling amount of the photoresist film below, i.e., the shrink amount of the opening diameter.

The method for applying the resist pattern swelling material is not especially limited and can be selected out of the known application methods suitably for ends, and spin coating or others, for example, are suitable. Conditions for the spin coating are, e.g., about 100-10000 rpm, preferably 800-5000 rpm, and about 1 second-10 minutes, preferably 1 second-90 seconds. The application thickness to be applied is usually about 10-1000 nm, more preferably 200-500 nm.

In the application, it is possible that the surfactant is not contained in the resist pattern swelling material but is applied separately before the application of the resist pattern swelling material.

The applied resist pattern swelling material is soft baked (thermally processed for heating and drying) preferably in or after the application of the resist pattern swelling material in terms of the efficient mixing (penetration) of the resist pattern swelling material into the photoresist film at the interface between the photoresist film and the resist pattern swelling material, etc.

Conditions, the method, etc. for the soft bake are not especially limited as long as they do not soften the lower photoresist film and can be selected suitably for ends. For example, the temperature is 40-120° C., preferably 70-100° C., and the time is about 10 seconds-5 minutes, preferably 40 to 100 seconds.

The soft bake is followed by the hard bake (thermal processing for the crosslinking reaction) of the applied resist pattern swelling material and is preferable in efficiently advancing the crosslinking reaction in the mixed part of the interface between the photoresist film and the resist pattern swelling material, etc.

Conditions, the method, etc. for the hard bake are not especially limited and can be selected suitably for ends. A higher temperature condition than that for the soft bake is usually used. As conditions for the hard bake, for example, the temperature is about 70-150° C., preferably 90-130° C., and the time is about 10 seconds-5 minutes, preferably 40-100 seconds.

When the resist pattern swelling material is applied to the patterned novolak-based photoresist film and crosslinked, the opening in the photoresist film is swelled to shrink the diameter of the opening. The swelling amount of the photoresist film, i.e., the shrink amount of the opening diameter can be controlled in a prescribed range by suitably adjusting the composition, the composition ratio, the mixed quantity, the concentration, the viscosity, the applied thickness, the baking temperature, baking period of time, etc. of the resist pattern swelling material.

FIG. 2 is a graph of the shrink amount of the opening and the pre-bake temperature of the photoresist. The pre-bake is here the bake processing which is performed after the photoresist material has been applied and before the process of swelling the resist pattern and is performed so as to volatile the solvent in the photoresist material to solidify the photoresist material. The swelling treatment of the resist pattern is conducted under conditions that the soft bake at 85° C. for 60 seconds, hard bake at 95° C. for 60 seconds, and deionized water treatment for 60 seconds. IP3500 from Tokyo Ohka Kogyo Co., Ltd. is used for the photoresist.

As shown, as the pre-bake temperature rises, the shrink amount decreases. This will be because as the pre-bake temperature rises, the denseness of the photoresist film is higher, which the decrease of the hydrophilicity due to the immersion of the developer, etc. is lessened.

When the electrode is formed by lift-off method, at least an about 0.05 μm-reverse-taper is necessary on one side. In consideration of this point, it is desirable to set the pre-bake temperature at below 120° C.

Based on the result shown in FIG. 2, it is found that the shrink amount can be controlled by pre-bake temperature. It is possible to change the shrink amount between the upper part and the lower part of the opening by laminating the photoresist film formed under conditions of the high pre-bake temperature, and the photoresist film formed under conditions of the low pre-bake temperature the latter on the former, and forming the opening in the photoresist films and making the swelling processing, whereby the taper of the opening can be easily increased, and the shrink amount can be controlled with high accuracy.

Specifically, when IP3500 from Tokyo Ohka Kogyo Co., Ltd. of different pre-bake temperatures are laminated in two layers, the lower resist pre-backed at 120° C. and the upper resist pre-baked at 105° C. are laminated, exposed and developed, and the opening is shrunk. A reverse-taper of about 0.05 μm on one side (a difference between the position of the opening end of the upper resist and the position of the opening end of the lower resist) can be formed.

FIG. 3 is a graph of relationships between the shrink amount and kinds of resins. In FIG. 3, Resin A is novolak resin (IP3500 from Tokyo Ohka Kogyo Co., Ltd.), Resin B is poly (methyl acrylate) (PMMA from MCC), Resin C is polystyrene polymer (ZEP520 from Zeon Corporation), and Resin D is poly (methyl glutarimide) (PMGI from MCC).

As shown, the shrink amount of the resist pattern is greatly different, depending on resins forming the resist material. This difference will be due to different reactivities of the resins with respect to the resist pattern swelling material, mainly due to the hydrophilicity of the resist material and different affinities of the resist material with respect to the resist pattern swelling material.

The affinity with the resist pattern swelling material is, e.g., degrees of the compatibility or mutual solubility between the resist material and the resist pattern swelling material. The resist pattern swelling material is water soluble, and it can be said that the resist pattern swelling material is basically affinitive with the hydrophilic resist. However, in the case that the affinity of the resist is low, the resist pattern cannot be swelled, even when the resist is hydrophilic. For example, based on the result shown in FIG. 3, novolak resin and PMGI exhibit the same hydrophilicity, but the resist pattern swelling material is not affinitive with PMGI and cannot swell the resist pattern.

Based on the result shown in FIG. 3, the shrink amount can be controlled by materials of the resist film. It is also possible to lay a photoresist film of a material of a small shrink amount and a photoresist film of a material of large shrink amount, the opening is formed in the layer film, and the layer film is subjected to the swelling processing, whereby the shrink amount of the upper part of the opening and that of the lower part thereof is changed. Thus, the taper of the opening can be easily increased, and the shrink amount can be controlled with high accuracy.

The resins shown in FIG. 3 have basic structures different from one another, and it is difficult to define a suitable affinity for the present invention. In laminating two resin layers to realize the reverse-taper, materials of the resins whose contact angles to the resist pattern swelling material dropped thereon are different from each other by above 5° are selected, and the resin of the larger contact angle is laid below, and the resin of the smaller contact angle laid thereon, whereby the reverse-taper of about 0.05 μm on one side, which is required for the lift-off method, will be able to be realized. At least the upper layer resin must have photosensitivity.

It is effective in increasing the taper of the opening that the processing for improving the hydrophilicity is positively applied to the surface region of the photoresist film. As for the processing, ashing treatment of the photoresist film may be applied.

As described above, according to the present embodiment, when the photoresist film is swelled, the depth-wise distribution of the hydrophilicity and the affinity with the resist pattern swelling material in the opening is utilized to thereby easily form a resist pattern having a higher shrink ratio in upper parts of the opening, i.e., the side wall of the opening reverse-tapered.

[A Second Embodiment]

The semiconductor device and the method for fabricating the same according to a second embodiment of the present invention will be explained with reference to FIGS. 4 to 6D.

Figure 4:
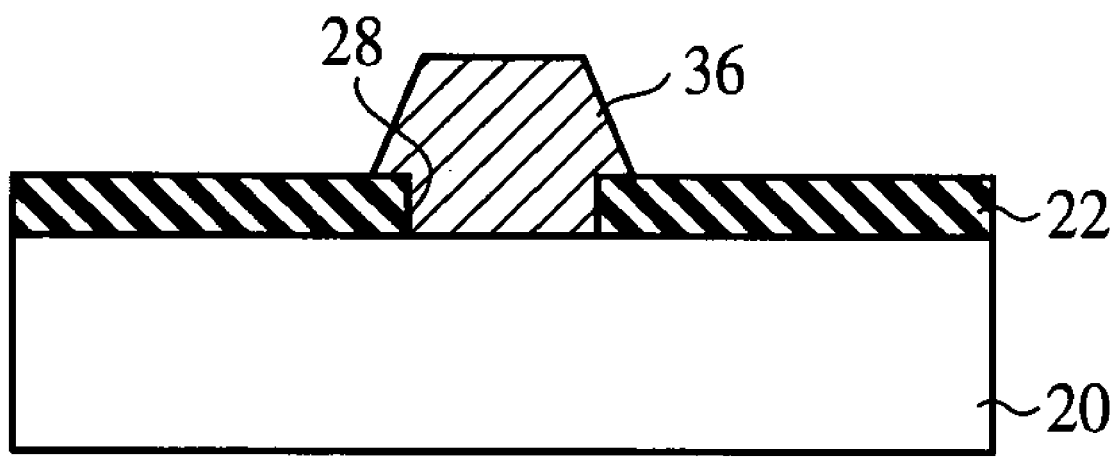
FIG. 4 is a diagrammatic sectional view of the semiconductor device according to a second embodiment of the present invention, which shows a structure thereof.

FIG. 4 is a diagrammatic sectional view of the semiconductor device according to the present embodiment, which shows a structure thereof. FIGS. 5A-5D and 6A-6D are sectional views of the semiconductor device according to the present embodiment in the steps of the method for fabricating the same, which show the method.

First, the structure of the semiconductor device according to the present embodiment will be explained with reference to FIG. 4.

An insulating film 22 is formed on a compound semiconductor substrate 20 with a compound semiconductor layer of, InP, GaN or others is formed on. An opening 28 down to the compound semiconductor substrate 20 is formed in the insulating film 22. On the insulating film 22 with the opening 28 formed in, a gate electrode 36 is formed in contact with the compound semiconductor substrate 20 in the opening 28, extended over the insulating film 22 and having the sidewall forward-tapered. In this specification, the forward-taper means that the width of the electrode is decreased upward.

In the semiconductor device according to the present embodiment, the resist pattern forming method according to the first embodiment is used in forming the gate electrode 36, whereby the gate electrode 36 can be formed by one lithography step, the over-gate portion of the gate electrode 36 can be easily aligned with the opening 28, with high reproducibility. Accordingly, the fluctuations of the device characteristics can be much decreased.

Furthermore, the surface region of the compound semiconductor substrate other than the region where the gate electrode 36 is in contact with the semiconductor substrate 20 can be covered with the insulating film 22. The surface of the compound semiconductor substrate 20 is passivated by the insulating film 22, whereby the formation of trap states due to surface states can be suppressed to thereby prevent kink phenomena, collapse phenomena, etc. It is known that the surface of compound semiconductor materials of InP group, GaN group, etc. are unstable, and the structure that the region of surface region other than the region for the gate electrode formed is passivated by the insulating film 22 is especially effective.

Then, the method for fabricating the semiconductor device according to the present embodiment will be explained with reference to FIGS. 5A-5D and 6A-6D.

Figure 5A:
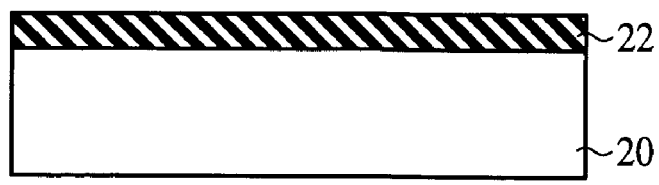
FIGS. 5A-5D and 6A-6D are sectional views of the semiconductor device according to the second embodiment of the present invention in the steps of the method for fabricating the same, which show the method.

First, a silicon nitride film or a silicon oxynitride film of, e.g., a 20 nm-thick is deposited on the compound semiconductor substrate 10 by, e.g., plasma CVD method to form the insulating film 22 of the film (FIG. 5A). In the specification of the present application, the compound semiconductor substrate includes the semiconductor substrate itself and also the semiconductor substrate with prescribed functional layers formed on.

Figure 5B:
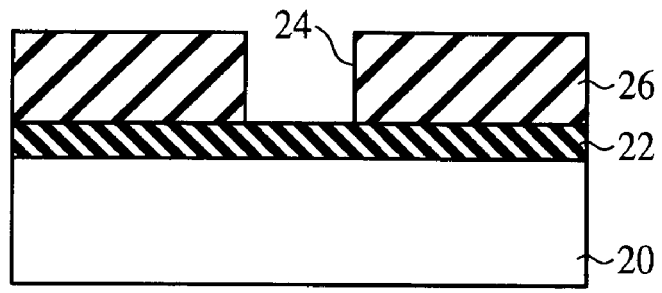

Next, a novolak-based photoresist (e.g., PFI-32 by Sumitomo Chemical Co., Ltd. or others) of, e.g., 800 nm-thick is formed on the insulating film 22 by spin coating, and the gate opening is patterned by i-line exposure. Thus, the photoresist film 26 having an opening 24 in the gate opening is formed (FIG. 5B).

Next, the insulating film 22 is etched by dry etching with the photoresist film 26 as the mask to form in the insulating film 22 the opening 28 exposing the surface of the compound semiconductor substrate 20.

Figure 5C:
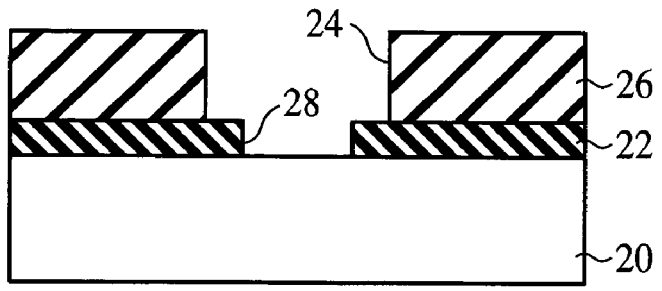

At this time, the insulating film 22 is dry etched with, e.g., $SF_6$ as the etching gas and under conditions, e.g., of a 50 V bias voltage, a 1.0 Pa pressure and a 60 nm-etching target film thickness. The photoresist film 26 whose side etching rate is higher than that of the insulating film 22, so that when the insulating film 22 is over-etched with respect to the film thickness of the insulating film 22, the photoresist film 26 is etched side-wise, and the opening 24 has a larger width than the opening 28 (FIG. 5C).

Figure 5D:
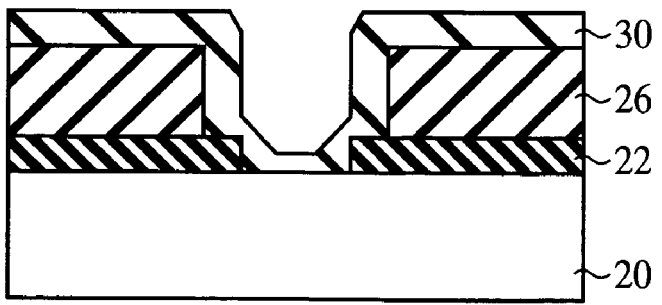

Then, the resist pattern swelling material is applied to the entire surface by spin coating method at a 3000 rpm rotation number and for a 60 second, for example, to thereby form the resist pattern swelling film 30 (FIG. 5D).

Figure 6A:
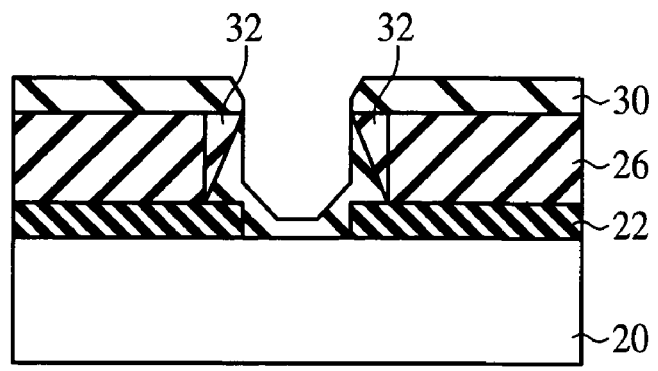

Then, soft bake, e.g., of 85° C. and of 70 seconds is performed to mix the photoresist film 26 on the end surface of the opening 24 with the resist pattern swelling film 30 to thereby form a mixing region 32 (FIG. 6A).

Then, hard bake, e.g., of 95° C. and 70 seconds is performed to crosslink the mixing region 32. The photoresist film 26 including the crosslinked mixing region 32 is called the photoresist film 26.

Figure 6B:
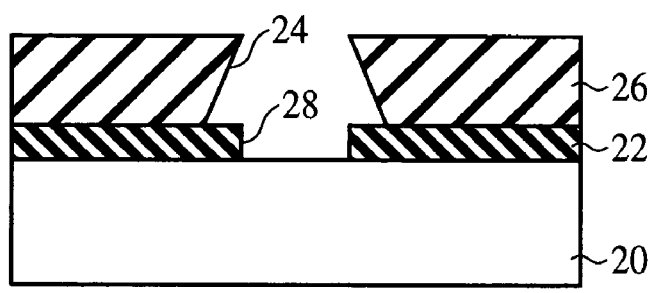

Then, development is performed with water, isopropyl alcohol or a weak alkaline aqueous solution for, e.g., 60 seconds to thereby dissolve and remove the resist pattern swelling film 30 which has not been crosslinked. Thus, the opening 24 in the shape of reverse-taper whose opening width is decreased upward (FIG. 6B). When the development was performed with water, the shrink amount of the opening upper end was about 0.1 μm, and the angle of the reverse-taper was about 7°.

Here, when the diameter of the opening 24 to be formed in the steps of FIGS. 5B and 5C is set to be a size of the resolution of the photoresist film 26, the above-described swelling processing is performed, whereby the upper opening diameter of the opening 24 can be decreased to below the resolution of the photoresist film 26.

Figure 6C:
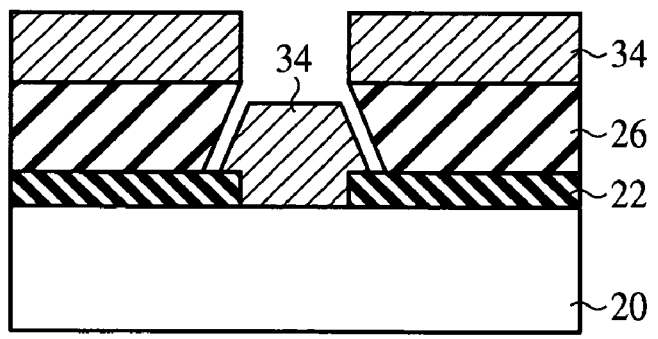

Then, a 1 nm-thick titanium (Ti) film, a 30 nm-thick platinum (Pt) film and a 500 nm-thick gold (Au) film are deposited the latter on the former to form a conducting film of the layer film of these metals (FIG. 6C).

Figure 6D:
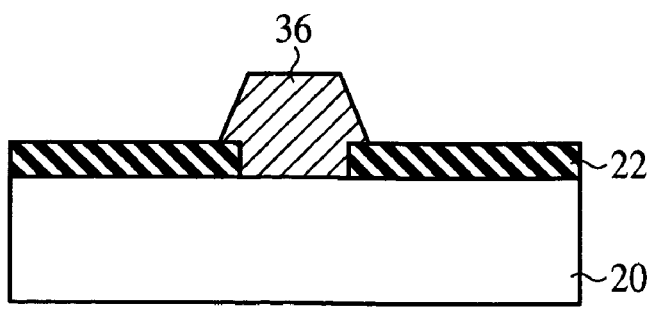

Then, the conducting film 34 on the photoresist film 26 and the photoresist film 26 are removed by lift-off method to leave the conducting film 34 selectively on the compound semiconductor substrate 20 in the opening 28 to form the gate electrode 36 of the conducting film 34 (FIG. 6D).

As described above, according to the present embodiment, when the photoresist film is swelled, the swelling amount is increased at upper parts of the opening by utilizing the depth-wide distribution of the hydrophilicity and the affinity with the resist pattern swelling material in the opening, whereby the opening which is reverse-tapered can be formed in the photoresist film. In this case, the dry etching improves the affinity with the resist pattern swelling material selectively at the upper parts of the opening.

The swelling processing is performed after the opening has been formed in the photoresist film by photolithography, whereby the opening can have a smaller opening diameter than an opening diameter of the opening formed by the photolithography. Whereby the opening having the opening diameter below the resolution of the photoresist and the sidewall reverse-tapered can be formed. The photoresist film having such opening is suitable to form the electrode by lift-off method.

Also in forming the T-shaped electrode an end part of which is extended over the insulating film 22, the gate electrode 36 can be formed by one photolithography step. This makes the fabrication steps simple, and the over-gate part of the gate electrode 36 can be aligned with the opening 28 easily with good reproducibility. Accordingly, the fluctuations of the device characteristics can be greatly decreased.

The region of the surface of the compound semiconductor substrate 20 except the region where the gate electrode 36 is in contact with the compound semiconductor substrate 20 is covered by the insulating film 22, whereby the surface of the compound semiconductor substrate 20 is passivated by the insulating film 22, and the formation of trap states of the carriers due to surface states can be suppressed, and kink phenomena, collapse phenomena, etc. can be prevented.

[A Third Embodiment]

The semiconductor device and the method for fabricating the same according to a third embodiment of the present invention will be explained with reference to FIGS. 7 to 10C.

Figure 7:
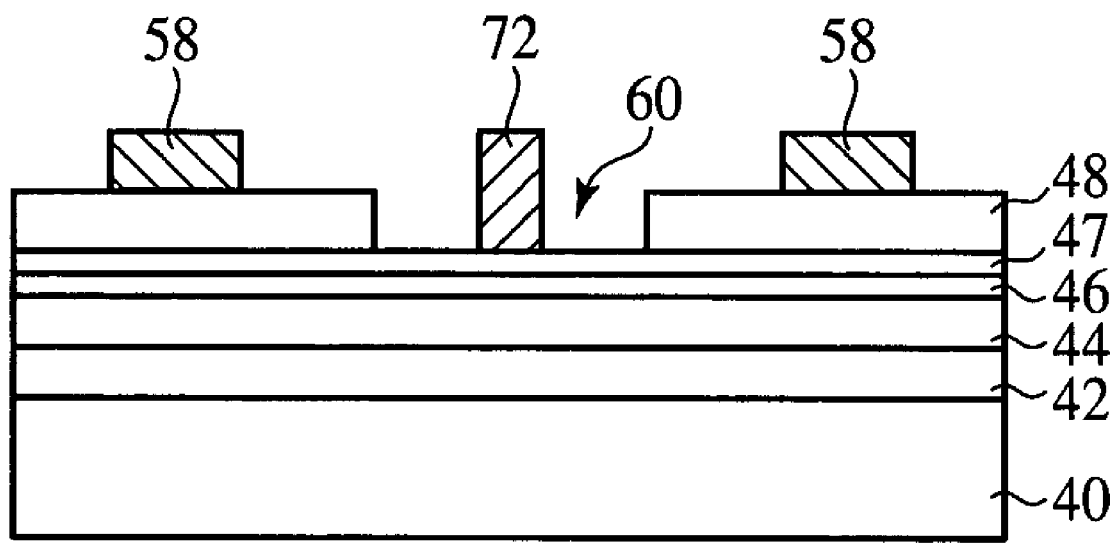
FIG. 7 is a diagrammatic sectional view of a semiconductor device according to a third embodiment of the present invention, which shows a structure thereof.

FIG. 7 is a diagrammatic sectional view of the semiconductor device according to the present embodiment, which show a structure thereof. FIGS. 8A-8D, 9A-9C and 10A-10C are sectional views of the semiconductor device according to the present embodiment in the steps of the method for fabricating the same, which show the method.

First, the structure of the semiconductor device according to the present embodiment will be explained with reference to FIG. 7.

A buffer layer 42 of InAlAs is formed on an InP substrate 40. On the buffer layer 42, a channel layer 44 of InGaAs is formed. A carrier-supplying layer 46 of InAlAs is formed on the channel layer 44. The carrier-supplying layer 46 has the layer structure of i-InAlAs/n-InAlAs/1-InAlAs. On the carrier-supplying layer 46, a stopper layer 47 of InP is formed. On the stopper layer 47, a cap layer 48 of n-InGaAs is formed.

On the cap layer 48, ohmic electrodes 58 to be a source electrode and a drain electrode are formed. A gate recess region 60 is provided in the cap layer 48 between the ohmic electrodes 58 down to the stopper layer 47. A gate electrode 72 is formed on the stopper layer 47 in the gate recess region 60.

Next, the method for fabricating the semiconductor device according to the present embodiment will be explained with reference to FIGS. 8A to 10C.

First, on the InP substrate 40, the buffer layer 42 of InAlAs, the channel layer 44 of InGaAs, the carrier-supplying layer 46 of the layer structure of i-InAlAs/n-InAlAs/1-InAlAs, the stopper layer 47 of InP and the cap layer 48 of n-InGaAs are sequentially deposited by, e.g., MOCVD method.

Then, a novolak-based photoresist (e.g., IP3500 from Tokyo Ohka Kogyo Co., Ltd.) of, e.g., a 1 μm-thick is applied to the cap layer 48 by, e.g., spin coating method, and pre-bake is performed at 100° C. for 90 seconds to form a photoresist film 50.

Figure 8A:
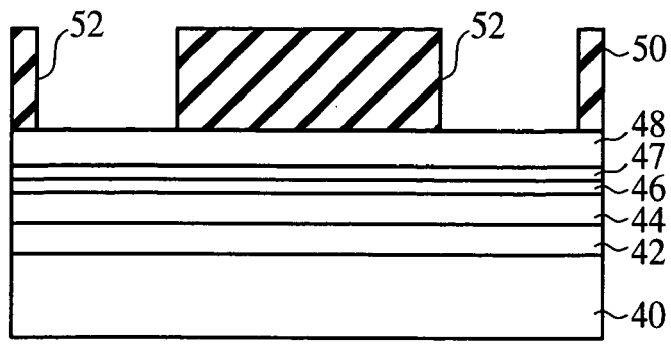
FIGS. 8A-8D, 9A-9C, and 10A-10C are sectional views of the semiconductor device according to the third embodiment of the present invention in the steps of the method for fabricating the same, which show the method.

Next, the photoresist film 50 in the regions for the ohmic electrodes to be formed in is exposed by photolithography using i-line and developed by an alkaline developer to thereby form openings 52 in the photoresist film 50 down to the cap layer 48 (FIG. 8A). The openings 52 have higher hydrophilicity and higher affinity with the resist pattern swelling material toward the surface of the photoresist film 50 where the relative exposure is larger and the exposure period of time for the exposure to the developer is longer, and have lower hydrophilicity and affinity with the photoresist pattern swelling material toward the cap layer 40 where the relative exposure is smaller and the exposure period time for the exposure to the developer is shorter.

Figure 8B:
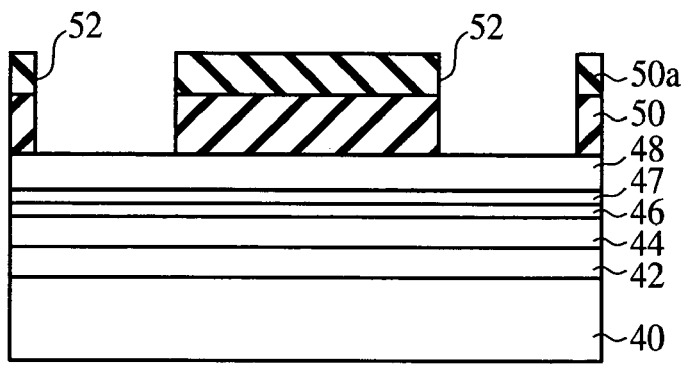

Then, ashing of, e.g., 100 W and for 100 seconds is performed. The ashing processing further increases the hydrophilicity and the affinity with the resist pattern swelling material near to the surface of the photoresist film 50 to thereby form a higher hydrophilic region 50a in the surface of the photoresist film 50 (FIG. 8B).

Figure 8C:
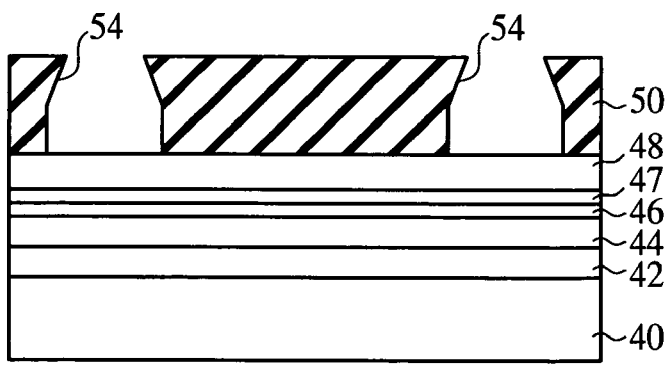

Then, in the same way as in the resist pattern forming method according to, e.g., the first embodiment, the photoresist film 50 is subjected to the swelling processing. First, the resist pattern swelling material is applied in a 300 nm-thick by spin coating method of, e.g., 3000 rpm and 60 seconds, and the mixing and crosslinking are performed by thermal processing of, e.g., 95° C. and 60 seconds. Then, deionized water treatment is performed, e.g., for 60 seconds to remove the resist pattern swelling material which has not been crosslinked. Thus, the openings 54 have the upper opening width decreased by about 0.2 μm and the bottom opening width decreased by about 0.1 μm and is reverse-tapered by about 7° (FIG. 8C). It is preferable to set the concentration of the resist pattern swelling material suitably in accordance with a desired size shift (shrink amount) necessary for the photoresist film 50.

Figure 8D:
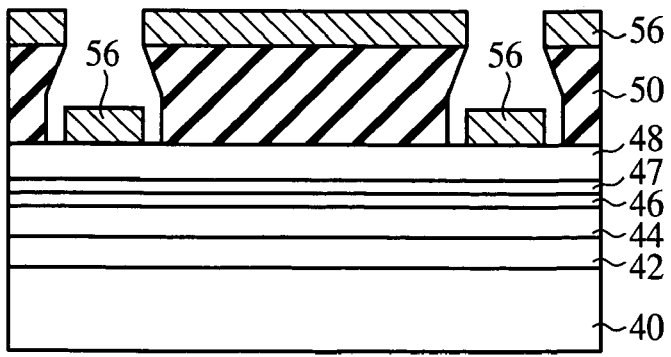

Then, a 20 nm-thick AuGe film and a 200 nm-thick Au film are sequentially deposited by, e.g., evaporation or sputtering to form a conducting film 56 of the layer film of these metals (FIG. 8D).

Figure 9A:
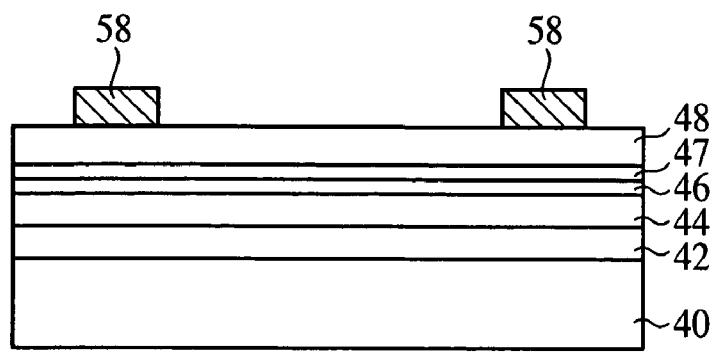

Next, lift-off is performed with a heated organic solvent to remove the photoresist film 50 together with the conducting film 56 on the photoresist film 50 to leave the conducting film 56 selectively on the cap layer 48 in the openings 54. Thus, the ohmic electrodes 58 of the conducting film 56 are formed (FIG. 9A).

Figure 9B:
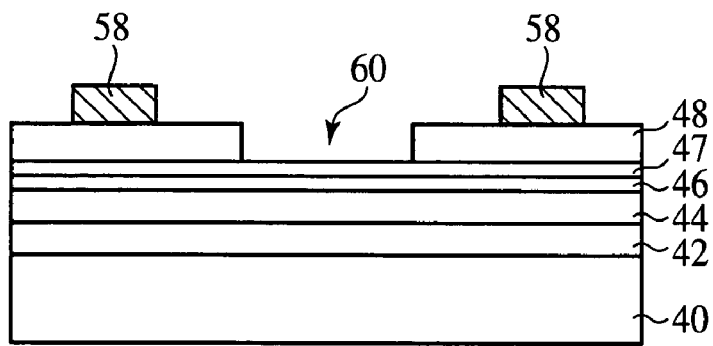

Then, the cap layer 48 in the region for the gate electrode to be formed in is removed by photolithography and wet etching to form the gate recess region 60 (FIG. 9B).

Next, a novolak-based photoresist (e.g., IP3500 from Tokyo Ohka Kogyo Co., Ltd.) of, e.g., a 0.5 μm-thick is formed on the entire surface by, e.g., spin coating method, and pre-bake is performed at 120° C. and for 90 seconds to form a photoresist film 62.

Then, a novolak-based photoresist (e.g., IP3500 from Tokyo Ohka Kogyo Co., Ltd.) of, e.g., a 0.5 μm-thick is formed on the photoresist film 62 by, e.g., spin coating method, and pre-bake is performed at 100° C. for 90 seconds to form a photoresist film 64.

Figure 9C:
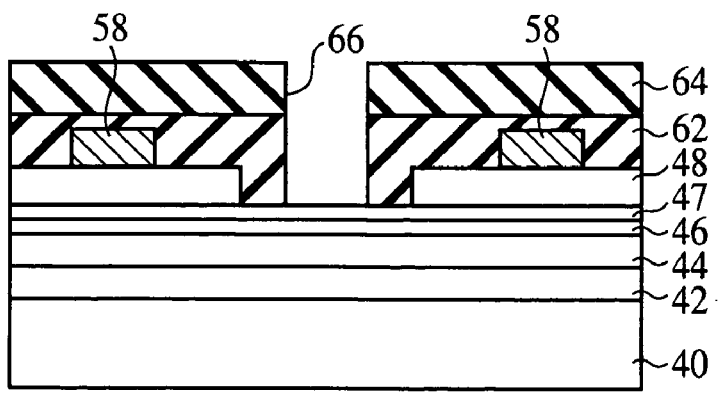

Next, the photoresist films 62, 64 in the region for the gate electrode to be formed in are exposed by photolithography using i-line and are developed by an alkaline developer to form an opening 66 of a 0.6 μm-width in the photoresist films 62, 64 down to the stopper layer 47 (FIG. 9C). The opening 66 has higher hydrophilicity and higher affinity with the resist pattern swelling material toward the surface of the photoresist film 64 where the relative exposure is larger, and the exposure period of time to the develop is longer, and lower hydrophilicity and lower affinity with the resist pattern swelling material toward the photoresist film 62 nearer to the carrier-supplying layer 46 where the relative exposure is shorter, and the exposure period of time to the develop is shorter. The photoresist film 64 whose pre-bake temperature is lower has higher hydrophilicity and higher affinity with the resist pattern swelling material than the photoresist film 62 whose pre-bake temperature is higher.

Figure 10A:
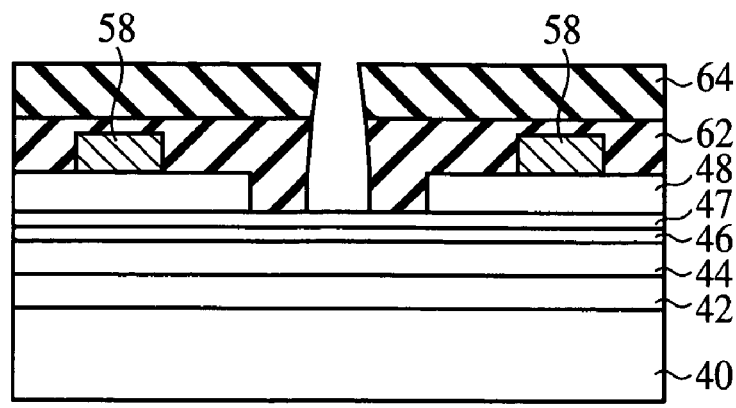

Then, in the same way as in the resist pattern forming method according to, e.g., the first embodiment, the photoresist films 62, 64 are subjected to the swelling processing. First, the resist pattern swelling material is applied in a 300 nm-thick by spin coating method of, e.g., 3000 rpm and 60 seconds, and the mixing and crosslinking are performed by thermal processing of, e.g., 95° C. and 60 seconds. Then, deionized water treatment is performed, e.g., for 60 seconds to remove the resist pattern swelling material which has not been crosslinked. Thus, the opening 66 has the upper opening width decreased by about 0.4 μm and the bottom opening width decreased by about 0.2 μm, and is reverse-tapered or has eave-shaped opening 68 (FIG. 10A). It is preferable to set the concentration of the resist pattern swelling material suitably in accordance with desired size shifts (shrink amounts) necessary for the photoresist films 62, 64.

Figure 10B:
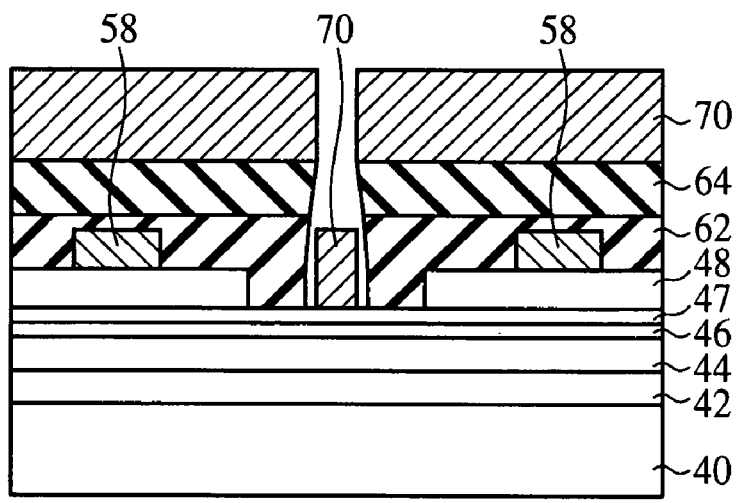

Next, a 10 nm-thick Ti film, a 20 nm-thick Pt film and a 300 nm-thick Au film are sequentially deposited by, e.g., evaporation or sputtering to form a conducting film 70 of the layer film of these metals (FIG. 10B).

Figure 10C:
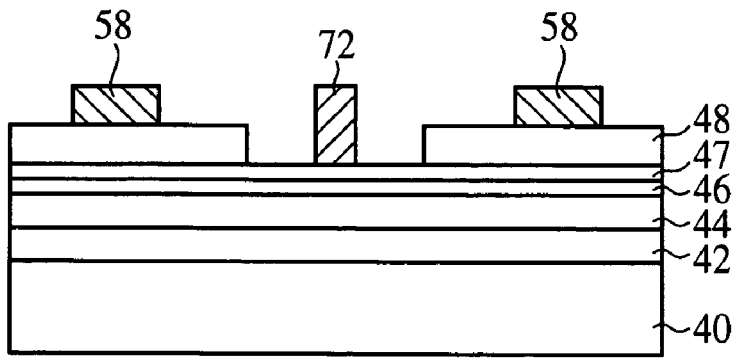

Then, lift-off is performed with a heated organic solvent to remove the photoresist films 62, 64 together with the conducting film 70 on the photoresist film 64 to leave the conducting film 70 selectively on the stopper layer 47 in the opening 68. Thus, the gate electrode 72 of the conducting film 70 is formed (FIG. 10C).

As described above, according to the present embodiment, the photoresist film of lower hydrophilicity and lower affinity with the resist pattern swelling material, and the photoresist film of higher hydrophilicity and higher affinity with the resist pattern swelling material are formed, and when the photoresist films are swelled, a depth-wise distribution of the hydrophilicity and the affinity with the resist pattern swelling material in the openings is utilized to make the swelling amount larger in upper part of the opening, whereby the reverse-tapered opening can be formed in the photoresist films.

The photoresist films having opening formed therein is subjected to the swelling processing, whereby the openings of a smaller diameter than the opening made by the photolithography can be formed. Thus, the opening can have diameter which is below the resolution of the photoresist and have the sidewall reverse-tapered. The resist films having such the opening are suitable for forming electrodes by lift-off method.

The hydrophilicity of the photoresist films, and their affinity with the resist pattern swelling material are controlled by the temperature of the pre-bake for forming the photoresist films, whereby the swelling amounts of the photoresist films in the openings can be accurately controlled.

[A Fourth Embodiment]

The method for fabricating the semiconductor device according to a fourth embodiment of the present invention will be explained with reference to FIGS. 11A-11C and 12A-12B. The same members of the present embodiment as those of the semiconductor device and the method for fabricating the same according to the third embodiment shown in FIGS. 7 to 10C are represented by the same reference numbers not to repeat or to simplify their explanation.

FIGS. 11A-11C and 12A-12B are sectional views of the semiconductor device according to the present embodiment in the steps of the method for fabricating the same, which show the method.

In the present embodiment, another method for fabricating the semiconductor device according to the third embodiment shown in FIG. 7 will be explained.

Figure 11A:
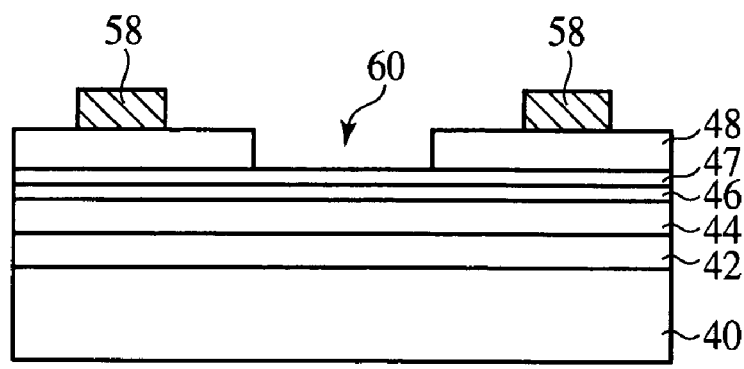
FIGS. 11A-11C and 12A-12B are sectional views of a semiconductor device according to a fourth embodiment of the present invention in the steps of the method for fabricating the same, which show the method.

In the same way as in the method for fabricating the semiconductor device according to the third embodiment shown in FIGS. 8A to 9B, the ohmic electrodes 58 and the gate recess region 60, etc. are formed (FIG. 11A).

Then, poly (methyl glutarimide) resin (PMGI from MCC) is applied to the entire surface in, e.g., a 0.5 μm-thick by, e.g., spin coating method, and pre-bake of 180° C. and for 120 seconds is performed to form a resin layer 74.

Then, a novolak-based photoresist (e.g., IP3500 from Tokyo Ohka Kogyo Co., Ltd.) of, e.g., a 0.5 μm-thick is applied to the resin layer 74 by, e.g., spin coating method, and pre-bake of 120° C. and 90 seconds is performed to form the photoresist film 76.

Then, the photoresist film 76 in the region for the gate electrode to be formed in is exposed by photolithography using i-line and developed with an alkaline developer to form the opening 66b of a 0.4 μm-opening width in the photoresist film 76.

Figure 11B:
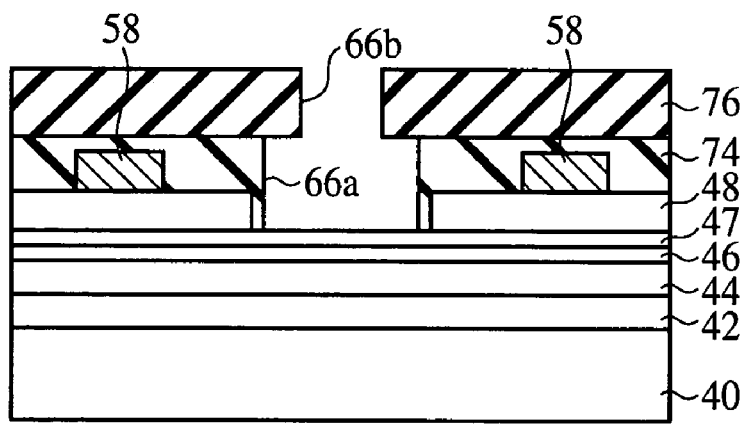

At this time, the resin layer 74 formed of the poly (methyl glutarimide) resin, which is alkali soluble, is etched with the developer for the photoresist film 76, and an opening 66a is formed in the resin layer 74. The etching rate with respect to the alkaline developer of the resin layer 74 is higher than that of the photoresist film 76, which makes the opening 66a in the resin layer 74 larger than the opening 66b in the photoresist film 76. Thus, the opening 66 formed in the resin layer 74 and the photoresist film 76 is substantially reverse-tapered or eave-shaped (FIG. 11B).

Next, the photoresist film 76 is swelled by the resist pattern forming method according to, e.g., the first embodiment. First, the resist pattern swelling material is applied in, e.g., a 1 μm-thick by spin coating method, and mixing and crosslinking are performed by thermal processing of, e.g., 95° C. and 60 seconds. Then, e.g., the deionized water treatment of 60 seconds is performed to remove the resist pattern swelling material which has not been crosslinked.

Figure 11C:
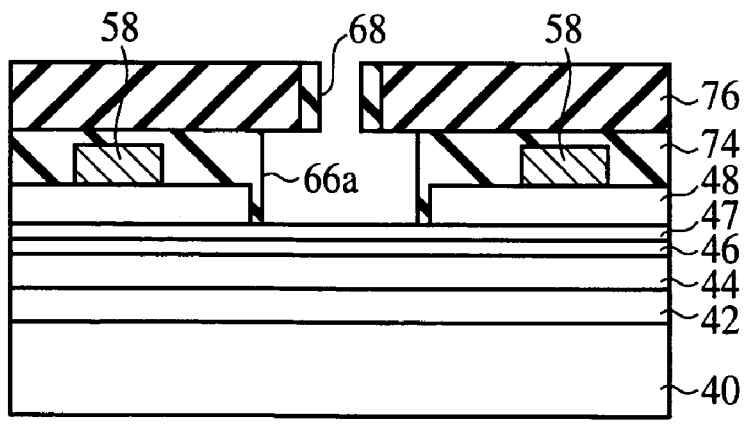

The resin layer 74 of PMGI, which has low affinity with the resist pattern swelling material, is not substantially swelled. Thus, the opening 66b has the opening width in the photoresist film 76 shrunk by about 0.2 μm, and the opening 68 is formed (FIG. 11C).

Figure 12A:
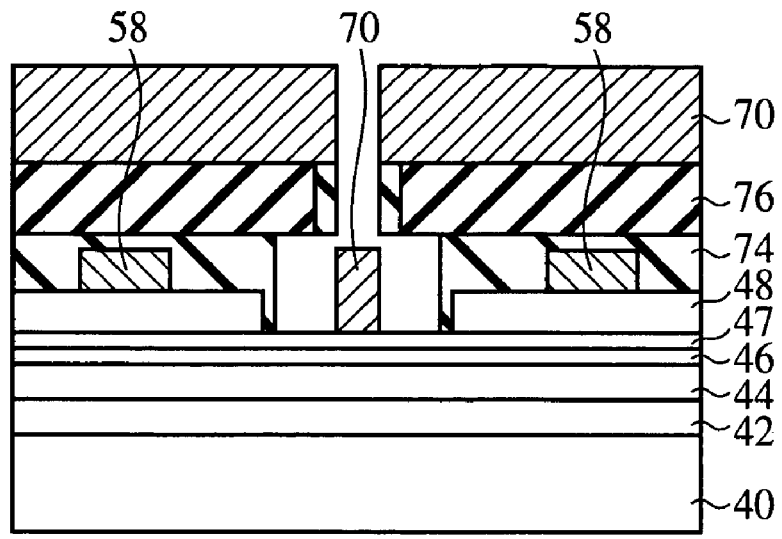

Next, a 10 nm-thick Ti film, a 20 nm-thick Pt film and a 300 nm-thick Au film are sequentially deposited by, e.g., evaporation or sputtering to form the conducting film 70 of the layer film of these metals (FIG. 12A).

Figure 12B:
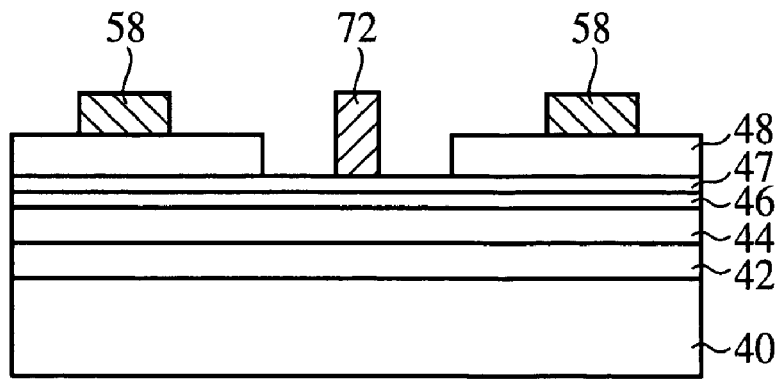
Figure 13A:
FIGS. 13A-13D and 14A-14C are sectional views of the semiconductor device in the steps of the conventional method for fabricating the same, which show the method.
Figure 13B:
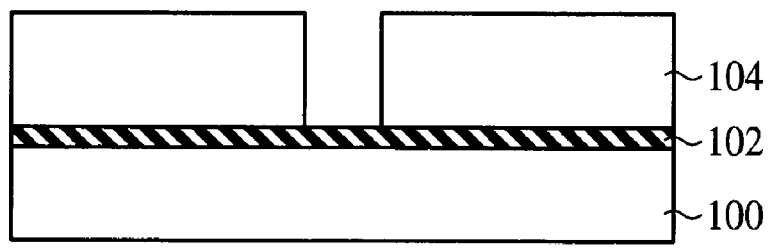
Figure 13C:
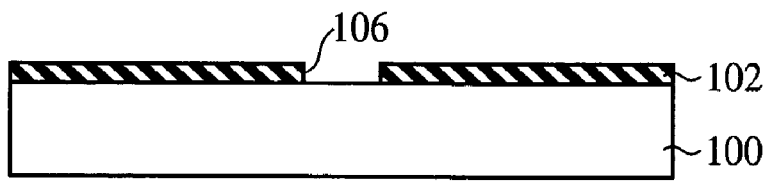
Figure 13D:
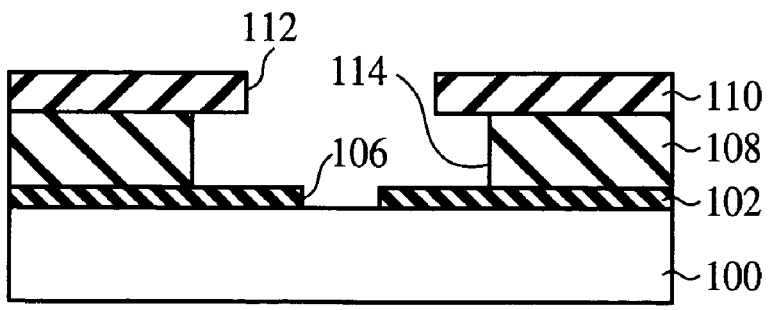
Figure 14A:
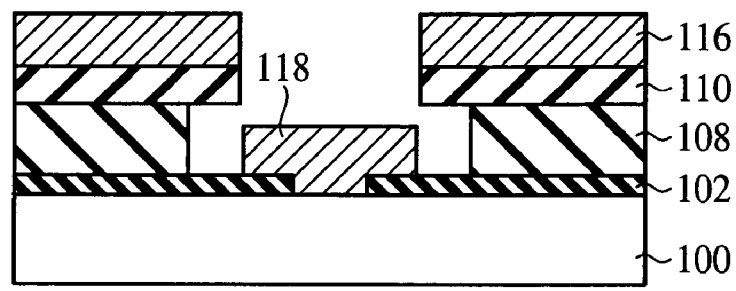
Figure 14B:
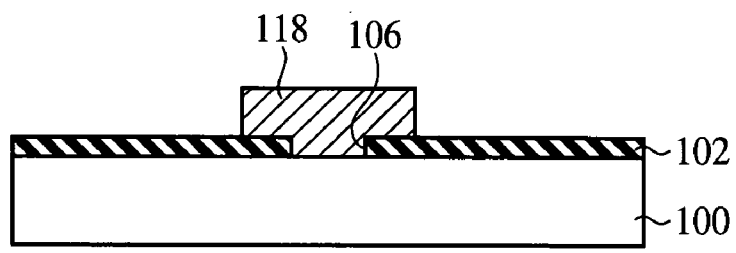
Figure 14C:
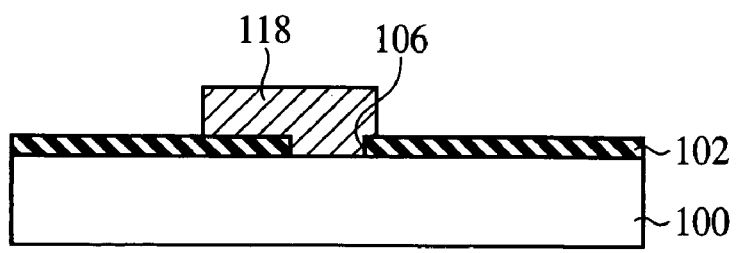

Next, lift-off is performed with a heated organic solvent to remove the photoresist films 74, 76 together with the conducting film 70 on the photoresist film 76 to leave the conducting film 70 selectively on the stopper layer 47 in the opening 68. Thus, the gate electrode 72 of the conducting film 70 is formed (FIG. 12B).

As described above, according to the present embodiment, the resin layer having low hydrophilicity and low affinity with the resist pattern swelling material, and the photoresist film of high hydrophilicity and high affinity with the resist pattern swelling material are formed, and when the photoresist film is swelled, a depth-wise distribution of the hydrophilicity and the affinity with the resist pattern swelling material in the opening is utilized to make the swelling amount larger at upper parts of the opening, whereby the photoresist films can have the opening reverse-tapered.

The swelling processing follows the formation of the opening in the photoresist films by photolithography, whereby the opening having an opening diameter which is smaller than an opening diameter formed by the photolithography can be formed. Thus, the opening can have an opening diameter below the resolution of the photoresist and has the sidewall reverse-tapered. The photoresist films having such opening are suitable to form electrodes by lift-off method.

The hydrophilicity and the affinity of the photoresist film with the resist pattern swelling material of the photoresist films are controlled by selecting the resin material forming the photoresist films, whereby the swelling amount of the photoresist films in the opening can be accurately controlled.

[Modified Embodiments]

The present invention is not limited to the above-described embodiments and can cover other various modifications.

For example, although in the second to the fourth embodiments described above, the resist pattern forming method according to the first embodiment is applied to the process for forming the gate electrode or the ohmic electrodes of a field effect transistor, the resist pattern forming method according to the present invention is not essentially applied to the gate electrode forming process and the ohmic electrode forming process. The resist pattern forming method according to the present invention is applicable widely to various processes requiring photoresist films having the sidewall of opening reverse-tapered, and is also applicable to the lift-off steps of forming the electrodes of passive elements, such as capacitors, inductors, etc.

In the second embodiment, the swelling processing is performed after the opening 28 has been formed in the insulating film 22, but after the swelling processing has been performed, the opening 28 may be formed. The gate electrode 36 is not essentially extended over the insulating film 22 and may be formed only in the opening 28. From the viewpoint of passivating the substrate surface, the gate electrode 36 is preferably formed on the entire surface in the opening 28.

In the third and the fourth embodiments, field effect transistors including the carrier-supplying layer formed of InAlAs layers are explained, but the semiconductor devices the gate electrode structure of the present invention is applicable to are not limited to them. For example, the present invention is applicable to a field effect transistor comprising on a GaAs substrate a buffer layer of GaAs, a channel layer of InGaAs, and a carrier-supplying layer of AlGaAs (layer structure of i-AlGaAs/n-AlGaAs/i-AlGaAs) or a carrier supplying layer of InGaP, and a cap layer of n-GaAs, in which the gate electrode is connected to the AlGaAs carrier-supplying layer.

In the third and the fourth embodiments, two photoresist films which are different from each other in hydrophilicity and the affinity with the resist pattern swelling material are laminated on each other, but three or more photoresist films may be laminated one on another.

What is claimed is:

1. A resist pattern forming method comprising the steps of:
   forming on a substrate a photoresist film having an opening down to the substrate, a sidewall of the photoresist film in the opening having hydrophilicity and affinity with a chemical liquid, and the hydrophilicity and affinity being increased upward; and
   reacting the chemical liquid for swelling the photoresist film with the photoresist film having the opening to swell the photoresist film and to reverse-taper the sidewall of the photoresist film in the opening.

2. A resist pattern forming method according to claim 1, further comprising, after the step of forming the photoresist film, the step of:
   performing a processing for increasing a hydrophilicity and a affinity with the chemical liquid of a surface region of the photoresist film.

3. A resist pattern forming method according to claim 1, wherein
   the step of forming the photoresist film includes the steps of:
      forming a first resin film;
      forming on the first resin film a second resin film whose reactivity with the chemical liquid is different from that of the first resin film; and
      forming the opening in the second resin film and the first resin film.

4. A resist pattern forming method according to claim 3, wherein
   a pre-bake temperature for forming the first resin film is higher than a pre-bake temperature for forming the second resin film.

5. A resist pattern forming method according to claim 3, wherein
   in the step of forming the first resin film, the first resin film containing a first base resin is formed, and
   in the step of forming the second resin film, the second resin film containing a second base resin whose reactivity with the chemical liquid is different from that of the first base resin and is photosensitive is formed.

6. A resist pattern forming method according to claim 3, wherein
   a contact angle of the first resin film to the chemical liquid is larger by not less than 5° than a contact angle of the second resin to the chemical liquid.

7. A resist pattern forming method according to claim 1, wherein
   a minimum opening width of the opening is below a resolution of the photoresist film.

8. A resist pattern forming method according to claim 1, wherein
   the photoresist film contains a film of a novolak-based photoresist material or a poly (methyl methacrylate)-based resist material.

9. A resist pattern forming method according to claim 1, wherein
   the chemical liquid contains at least one component selected from the group consisting of a resin, a crosslinking agent and a surfactant.

10. A resist pattern forming method according to claim 9, wherein
    the chemical liquid has water solubility or alkali solubility.

11. A resist pattern forming method according to claim 9, wherein
    the surfactant is a non-ionic surfactant.

12. A resist pattern forming method according to claim 9, wherein
    the resin is at least one material selected from the group consisting of poly (vinyl alcohol), poly (vinyl acetal) and poly(vinyl acetate).

13. A resist pattern forming method according to claims 9, wherein
    the crosslinking agent is at least one material selected from the group consisting of melamine derivatives, urea derivatives and uryl derivatives.

14. A resist pattern forming method according claim 9, wherein
    the chemical liquid further contains at least one material selected from the group consisting of water soluble aromatic compounds and resins partially containing aromatic compound.

15. A resist pattern forming method according to claim 14, wherein
    the water soluble aromatic compound is selected from the group consisting of polyphenol compounds, aromatic carboxylic compounds, naphthalene polyhydric alcohol compounds, benzophenone compounds, flavonoid compounds, their derivatives and their glycosides, and
    the resin partially containing aromatic compound is selected from the group consisting of poly (vinyl aryl acetal) resin, poly (vinyl aryl ether) resin and poly (vinyl aryl ester) resin.

16. A resist pattern forming method according to claim 9, wherein
the chemical liquid further contains as an organic solvent at least one solvent selected from the group consisting of alcohol-based solvents, chain ester-based solvents, cyclic ester-based solvents, ketone-based solvents, chain ether-based solvents and cyclic ether-based solvents.

17. A resist pattern forming method according to claim 1, wherein in the step of reacting the chemical liquid with the photoresist film, a soft baking at a first temperature and a hard baking at a second temperature higher than the first temperature are performed.

18. A semiconductor device fabrication method comprising the steps of:
forming over a semiconductor substrate a photoresist film having an opening down to the semiconductor substrate, a sidewall of the photoresist film in the opening having hydrophilicity and affinity with a chemical liquid, and the hydrophilicity and affinity being increased upward;
reacting the chemical liquid for swelling the photoresist film with the photoresist film having the opening to swell the photoresist film and to reverse-taper the sidewall of the photoresist film in the opening; and
depositing a conducting film, and then selectively removing the conducting film on the photoresist film together with the photoresist film to form an electrode of the conducting film in the opening.

19. A semiconductor device fabrication method comprising the steps of:
forming an insulating film over a semiconductor substrate;
forming on the insulating film a photoresist film having a first opening down to the insulating film, a sidewall of the photoresist film in the first opening having hydrophilicity and affinity with a chemical liquid, and the hydrophilicity and affinity being increased upward;
etching the insulating film with the photoresist film as a mask to form a second opening in the insulating film down to the semiconductor substrate;
reacting the chemical liquid for swelling the photoresist film with the photoresist film having the first opening to swell the photoresist film and to reverse-taper the sidewall of the photoregist film in the first opening; and
depositing a conducting film, and then selectively removing the conducting film on the photoresist film together with the photoresist film to form an electrode of the conducting film in the second opening.

20. A semiconductor device fabrication method according to claim 19, wherein
the step of forming the second opening is performed before the step of swelling the photoresist film.

21. A semiconductor device fabrication method according to claim 20, wherein
in the step of forming the second opening, a width of the first opening is made larger than a width of the second opening.

22. A semiconductor device fabrication method according to claim 21, wherein
in the step of forming the electrode, the electrode extended over the insulating film is formed.

23. A semiconductor device fabrication method according to claim 19, wherein
the step of forming the second opening is performed after the step of swelling the photoresist film.

24. A semiconductor device fabrication method according to claim 18, wherein in the step of reacting the chemical liquid with the photoresist film, a soft baking at a first temperature and a hard baking at a second temperature higher than the first temperature are performed.

25. A semiconductor device fabrication method according to claim 19, wherein in the step of reacting the chemical liquid with the photoresist film, a soft baking at a first temperature and a hard baking at a second temperature higher than the first temperature are performed.

* * * * *